United States Patent
Shimamoto et al.

(10) Patent No.: US 8,915,693 B2
(45) Date of Patent: Dec. 23, 2014

(54) ROBOT ARM HAVING LOWER ARM LINK SEPARABLE INTO TWO PARTS

(75) Inventors: Mitsuru Shimamoto, Tsu (JP); Takahiro Maekawa, Tsu (JP)

(73) Assignee: Nabtesco Corporation, Tokyo (JP)

( * ) Notice: Subject to any disclaimer, the term of this patent is extended or adjusted under 35 U.S.C. 154(b) by 52 days.

(21) Appl. No.: 13/703,161

(22) PCT Filed: May 24, 2011

(86) PCT No.: PCT/JP2011/061828
§ 371 (c)(1),
(2), (4) Date: Dec. 10, 2012

(87) PCT Pub. No.: WO2011/155320
PCT Pub. Date: Dec. 15, 2011

(65) Prior Publication Data
US 2013/0084156 A1    Apr. 4, 2013

(30) Foreign Application Priority Data
Jun. 10, 2010   (JP) .................. 2010-132695

(51) Int. Cl.
*B25J 9/08* (2006.01)
*H01L 21/677* (2006.01)
*B25J 19/00* (2006.01)
*B25J 9/04* (2006.01)
*B25J 9/10* (2006.01)
*B25J 11/00* (2006.01)
*H01L 21/687* (2006.01)

(52) U.S. Cl.
CPC .......... *H01L 21/677* (2013.01); *B25J 19/0066* (2013.01); *B25J 9/08* (2013.01); *B25J 9/042* (2013.01); *B25J 9/1065* (2013.01); *B25J 11/0095* (2013.01); *H01L 21/67742* (2013.01); *H01L 21/68707* (2013.01); *Y10S 901/28* (2013.01)
USPC ......................................... 414/744.5; 901/28

(58) Field of Classification Search
CPC ............ B25J 9/08; B25J 18/00; B25J 18/007; B25J 11/0095; B25J 19/0066; H01L 21/67742; H01L 21/68707
USPC ......................................... 414/744.5; 901/28
See application file for complete search history.

(56) References Cited

U.S. PATENT DOCUMENTS

| 6,450,757 | B1 | 9/2002 | Saeki et al. |
| 7,013,750 | B1 | 3/2006 | Kazami |
| 2003/0012632 | A1 | 1/2003 | Saeki et al. |

FOREIGN PATENT DOCUMENTS

JP    4-130190 U    11/1992

(Continued)

OTHER PUBLICATIONS

English translation of International Preliminary Report on Patentability from parent International application No. PCT/JP2011/061828.

(Continued)

*Primary Examiner* — Gerald McClain
(74) *Attorney, Agent, or Firm* — J-Tek Law PLLC; Jeffrey D. Tekanic; Scott T. Wakeman (57) ABSTRACT

A robot arm for transporting semiconductor wafers includes a hand, a lower arm link, and an upper arm link. The hand is connected to the lower arm link via a first joint, and the upper arm link is connected to the lower arm link via a second joint. The lower arm link is capable of being separated at a location between the first joint and the second joint.

18 Claims, 4 Drawing Sheets

(56) References Cited

FOREIGN PATENT DOCUMENTS

| | | | |
|---|---|---|---|
| JP | 06-262555 A | 9/1994 | |
| JP | 07-108483 A | 4/1995 | |
| JP | 07108483 A * | 4/1995 | ............... B25J 18/02 |
| JP | 09213768 A * | 8/1997 | .............. H01L 21/68 |
| JP | 2000-150617 A1 | 5/2000 | |
| JP | 2000-195923 A | 7/2000 | |
| KR | 20080018205 | 2/2008 | |
| WO | 2001/062448 A1 | 8/2001 | |

OTHER PUBLICATIONS

International Search Report dated Aug. 2, 2011 from parent International application No. PCT/JP2011/061828.

Office Action mailed Jan. 14, 2014 from the Japanese Patent Office in counterpart JP application No. 2010-132695, including English translation of substantive portions thereof.

Office Action mailed Nov. 28, 2013 from the Korean Patent Office in counterpart KR application No. 2013-70005-3, including English translation of prior art rejections.

* cited by examiner

ROBOT ARM HAVING LOWER ARM LINK SEPARABLE INTO TWO PARTS

CROSS-REFERENCE

This application is the US national stage of International Patent Application No. PCT/JP2011/061828 filed on May 24, 2011, which claims priority to Japanese Patent Application No. 2010-132695 filed on Jun. 10, 2010, the contents of which are hereby incorporated by reference into the present application.

TECHNICAL FIELD

The present application generally relates to a robot arm. For example, it relates to a robot arm that transports semiconductor wafers.

BACKGROUND ART

Robot arms that transport semiconductor wafers are known. Specifically, the robot arm inserts the semiconductor wafer into a process chamber, and removes the semiconductor wafer from the process chamber. A transfer chamber is connected to the process chamber. The robot arm is disposed in the transfer chamber. Semiconductor wafers are transferred between the transfer chamber and the process chamber by the robot arm. The transfer chamber corresponds to a small-sized clean room. The transfer chamber prevents impurities such as dust from adhering to the semiconductor wafers. The air (or gas) in the transfer chamber is kept clean. Furthermore, the transfer chamber interior may, in some cases, be maintained under a vacuum. The robot arm that operates within the transfer chamber is required to be a device that does not generate impurities.

The robot arm that transports the semiconductor wafers usually has two or more degrees of freedom. Typically, the robot arm is comprised of two links and a hand. In the present description, the two links will be called an upper arm link and a lower arm link. Typically, one end of the upper arm link is connected to an output shaft of a motor, and the other end of the upper arm link is connected to one end of the lower arm link. Furthermore, the other end of the lower arm link is connected to the hand. The upper arm link and the lower arm link are connected via a joint. The lower arm link and the hand are also connected via a joint. A bearing is mounted on each of the joints so that the links rotate smoothly. Examples of such robot arms are disclosed in Japanese Patent Application Publication No. 2000-150617 and Japanese Patent Application Publication No. 2000-195923. In robot arms that transport semiconductor wafers, the bearings mounted on the joints are shielded so that the transfer chamber interior is not contaminated.

SUMMARY OF THE INVENTION

There are situations in which a semiconductor wafer is exposed to a high temperature within the process chamber. Therefore, there are situations in which the robot arm transports a high-temperature semiconductor wafer. When the high-temperature semiconductor wafer comes into contact with the hand, the temperature of the hand increases, and the temperature of the joint disposed between the lower arm link and the hand also increases. As a result, the temperature of the bearing mounted on the joint increases. The temperature increase of the bearing accelerates the degradation of the lubricant within the bearing. Therefore, maintenance of the bearing of the joint disposed between the lower arm link and the hand is required to be performed more frequently than for a bearing of a joint disposed between the upper arm link and the lower arm link.

As was described above, the robot arm is disposed within the transfer chamber, the interior of which is maintained clean. The joint is required to be disassembled in order to perform maintenance of the bearing of the joint. If the maintenance of the bearing of the joint is performed within the transfer chamber, the interior of the transfer chamber will be contaminated. The technology disclosed in the present description provides a robot arm that can limit contamination within the transfer chamber during maintenance of the bearing.

In one aspect of the present teachings, a robot arm that transports semiconductor wafers comprises a hand, a lower arm link, and an upper arm link. The hand for holding the semiconductor wafer is connected to the lower arm link via a joint. The upper arm link is connected to the lower arm link via a joint. In the following description, the joint that connects the hand and the lower arm link will be called a first joint, and the joint that connects the lower arm link and the upper arm link will be called a second joint. In the robot arm disclosed in the following description, the lower arm link is configured to be separable at a location between the first joint and the second joint.

In the above robot arm, by separating the lower arm link, the hand and the lower arm link can be removed from the transfer chamber interior while maintaining the connection between the hand and the lower arm link. The first joint can be removed from the transfer chamber without disassembling the first joint. Thereafter, maintenance work can be performed on a bearing in the first joint outside the transfer chamber. According to the technology disclosed in the present description, contamination within the transfer chamber can be limited. Moreover, a replacement part, which is constructed of a distal end portion of the lower arm link, the first joint and the hand, may be prepared in advance, and it may be replaced with the distal end portion in the transfer chamber during the maintenance work.

As was described above, in the robot arm disclosed in the present description, the lower arm link is configured to be separable at a location between the first joint and the second joint. In the following description, the lower arm link connected to the upper arm link may be called a proximal end portion of the lower arm link, and the lower arm link connected to the hand may be called the distal end portion of the lower arm link. In the robot arm disclosed in the present description, the proximal end portion of the lower arm link and the distal end portion of the lower arm link may be overlapping in a direction perpendicular to a longitudinal direction of the lower arm link. In this case, a plurality of positioning pins is preferably inserted in (an) overlapping portion(s) of the proximal end portion and the distal end portion. When reassembling the proximal end portion of the lower arm link and the distal end portion of the lower arm link, the end portions can be accurately positioned by the plurality of positioning pins.

The technology disclosed in the present description can realize a robot arm that can limit contamination within the transfer chamber.

MODES FOR IMPLEMENTING THE INVENTION

Technical features of a robot arm, which will be described in the exemplary embodiment, will be briefly noted in the following.

(Feature 1) The robot arm is a horizontal type robot in which axial lines of a first bearing and a second bearing extend in a vertical direction, and that moves a hand in a horizontal plane.

(Feature 2) The thickness of a portion where a distal end portion and a proximal end portion of a lower arm link overlap equals the thickness of a non-overlapping portion adjacent to the overlapping portion.

(Feature 3) The distal end portion of the lower arm link is located on the upper side of the proximal end portion of the lower arm link.

(Feature 4) The distal end portion of the lower arm link and the proximal end portion of the lower arm link are fixed by a plurality of bolts, and the plurality of bolts is disposed on both sides of positioning pins along a longitudinal direction of the lower arm link.

(Feature 5) The positioning pins are fixed to the proximal end portion of the lower arm link. Accordingly, when separating the distal end portion of the lower arm link and the proximal end portion of the lower arm link, the positioning pins are detached from the distal end portion of the lower arm link.

Exemplary Embodiment

Figure 1:
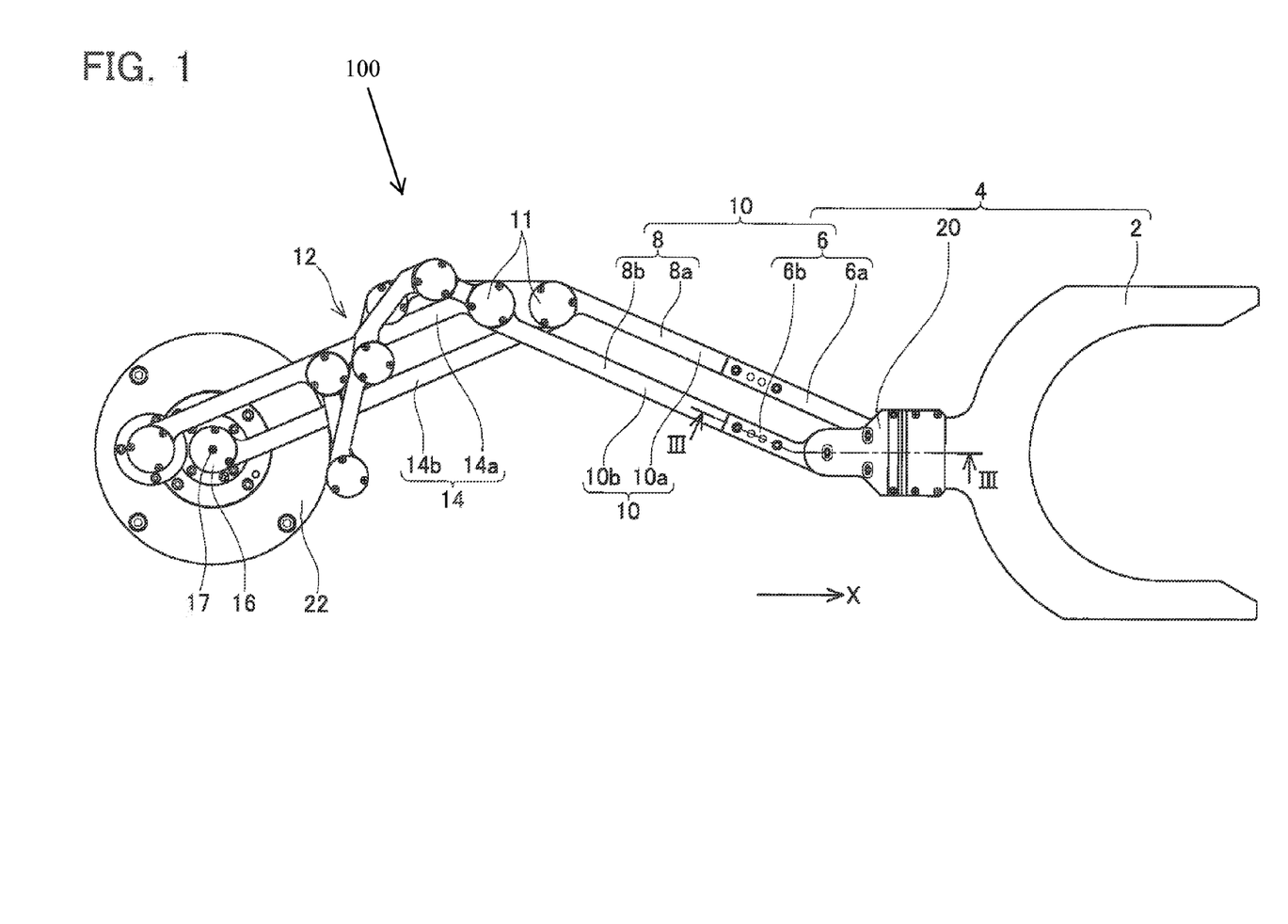
FIG. 1 shows a plan view of a robot arm.
Figure 2:
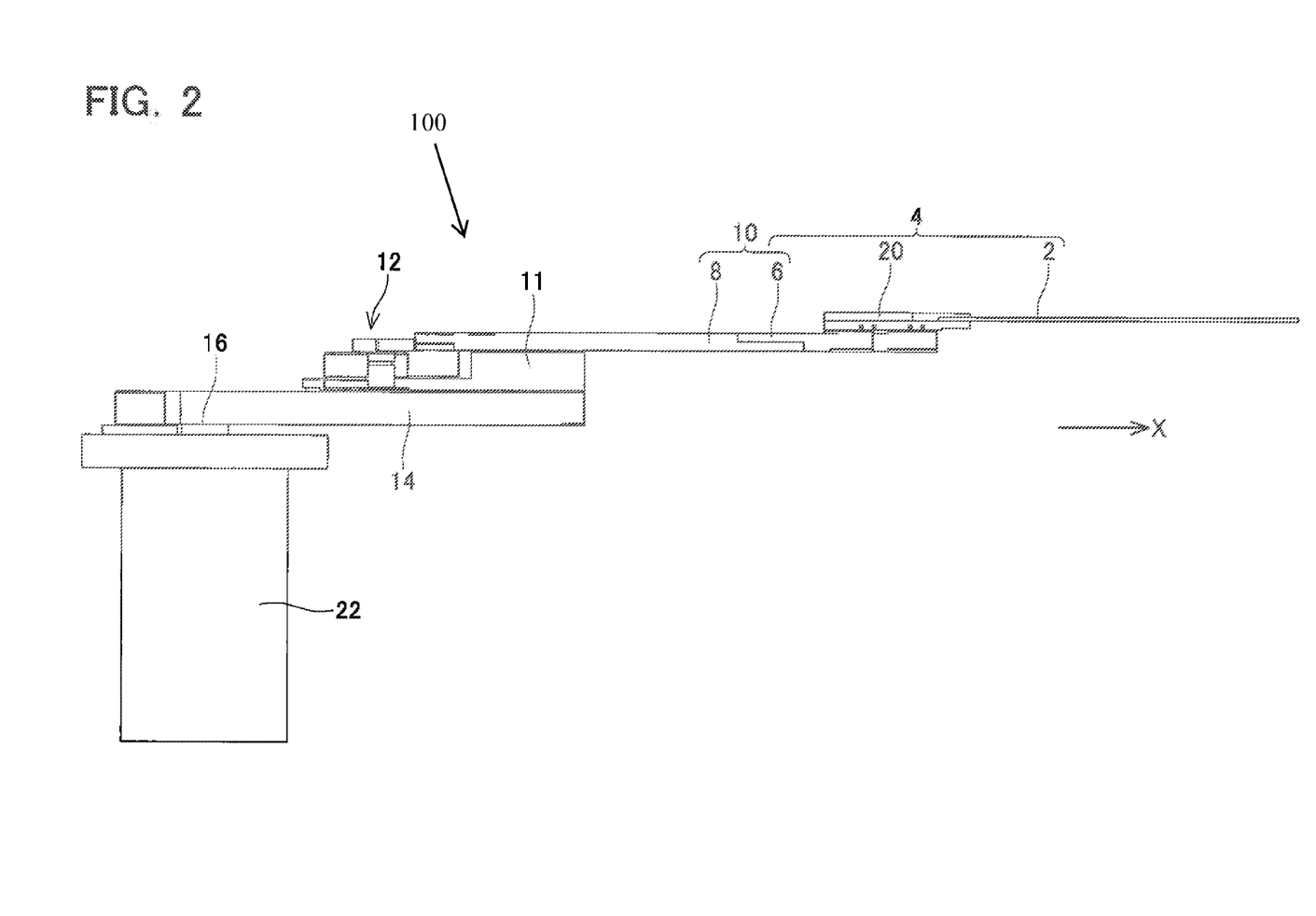
FIG. 2 shows a side view of the robot arm.

A robot arm 100 will be described with reference to FIG. 1 and FIG. 2. The robot arm 100 comprises an upper arm link 14, a lower arm link 10, and a hand 2. The robot arm 100 is attached to a supporting box 22. The upper arm link 14 is comprised of a first upper arm link 14a and a second upper arm link 14b. A motor for driving the second upper arm link 14b is disposed in the supporting box 22.

The lower arm link 10 is comprised of a first lower arm link 10a and a second lower arm link 10b. The first lower arm link 10a and the second lower arm link 10b are kept parallel at all times. One end of the lower arm link 10 (first lower arm link 10a and second lower arm link 10b) is connected to the hand 2 via a first joint 20. The other end of the lower arm link 10 is connected to the upper arm link 14 via a second joint 11.

The first lower arm link 10a is comprised of a first lower arm link proximal end portion 8a and a first lower arm link distal end portion 6a. The second lower arm link 10b is comprised of a second lower arm link proximal end portion 8b and a second lower arm link distal end portion 6b. In the following description, the first lower arm link proximal end portion 8a and the second lower arm link proximal end portion 8b may simply be called a lower arm link proximal end portion 8. The first lower arm link distal end portion 6a and the second lower arm link distal end portion 6b may simply be called a lower arm link distal end portion 6.

A second bearing (not shown) is disposed in the second joint 11. The second bearing smoothens rotation of the lower arm link 10 relative to the upper arm link 14. A first bearing is disposed in the first joint 20. The first bearing smoothens rotation of the hand 2 relative to the lower arm link 10.

The first upper arm link 14a and the second upper arm link 14b are kept parallel at all times. One end of the first upper arm link 14a is connected to the supporting box. One end 16 of the second upper arm link 14b is connected to the motor (not shown). Reference number 17 in FIG. 1 denotes the rotational axis of the second upper arm link 14b. The motor causes the second upper arm link 14b to rotate. The second upper arm link 14b may be characterized as a driving link that is driven by the motor. Furthermore, the first upper arm link 14a may be characterized as a follower link that operates in accordance with operation of the driving link (second upper arm link 14b). The upper arm link 14 moves in a horizontal plane by the motor driving the second upper arm link 14b. As a result, the hand 2 can be moved in the horizontal plane in the X-direction of FIG. 1. The robot arm 100 comprises a modulating link 12. Although a detailed description will be omitted, the modulating link 12 is comprised of a plurality of link groups, and is connected to the upper arm link 14 and the lower arm link 10. The modulating link 12 converts the rotation of the motor into linear movement of the hand 2. Because it can move the hand 2 in the horizontal plane, there are situations in which the robot arm 100 is called a horizontal robot arm.

The robot arm 100 is disposed in a transfer chamber (not shown), and is used for transporting semiconductor wafers. There are situations in which a high-temperature semiconductor wafer is placed in the hand 2. When the high-temperature semiconductor wafer comes into contact with the hand 2, the temperature of the hand 2 increases.

As was described above, the lower arm link 10 is comprised of the lower arm link proximal end portion 8 and the lower arm link distal end portion 6. The lower arm link proximal end portion 8 and the lower arm link distal end portion 6 can be separated at a location between the first joint 20 and the second joint 11. Specifically, the lower arm link proximal end portion 8 and the lower arm link distal end portion 6 can be separated at a substantially intermediate point between the first joint 20 and the second joint 11. As was described above, the other end (lower arm link distal end portion 6) of the lower arm link 10 is connected to the hand 2 via the first joint 20. Therefore, the lower arm link distal end portion 6 and the hand 2 can be removed from the transfer chamber interior while they remain connected by the first joint 20. In the following description, the lower arm link distal end portion 6, the first joint 20, and the hand 2 may be collectively called an arm distal end unit 4. In the robot arm 100, the arm distal end unit 4 can be removed from the transfer chamber by separating the lower arm link proximal end portion 8 and the lower arm link distal end portion 6.

Figure 3:
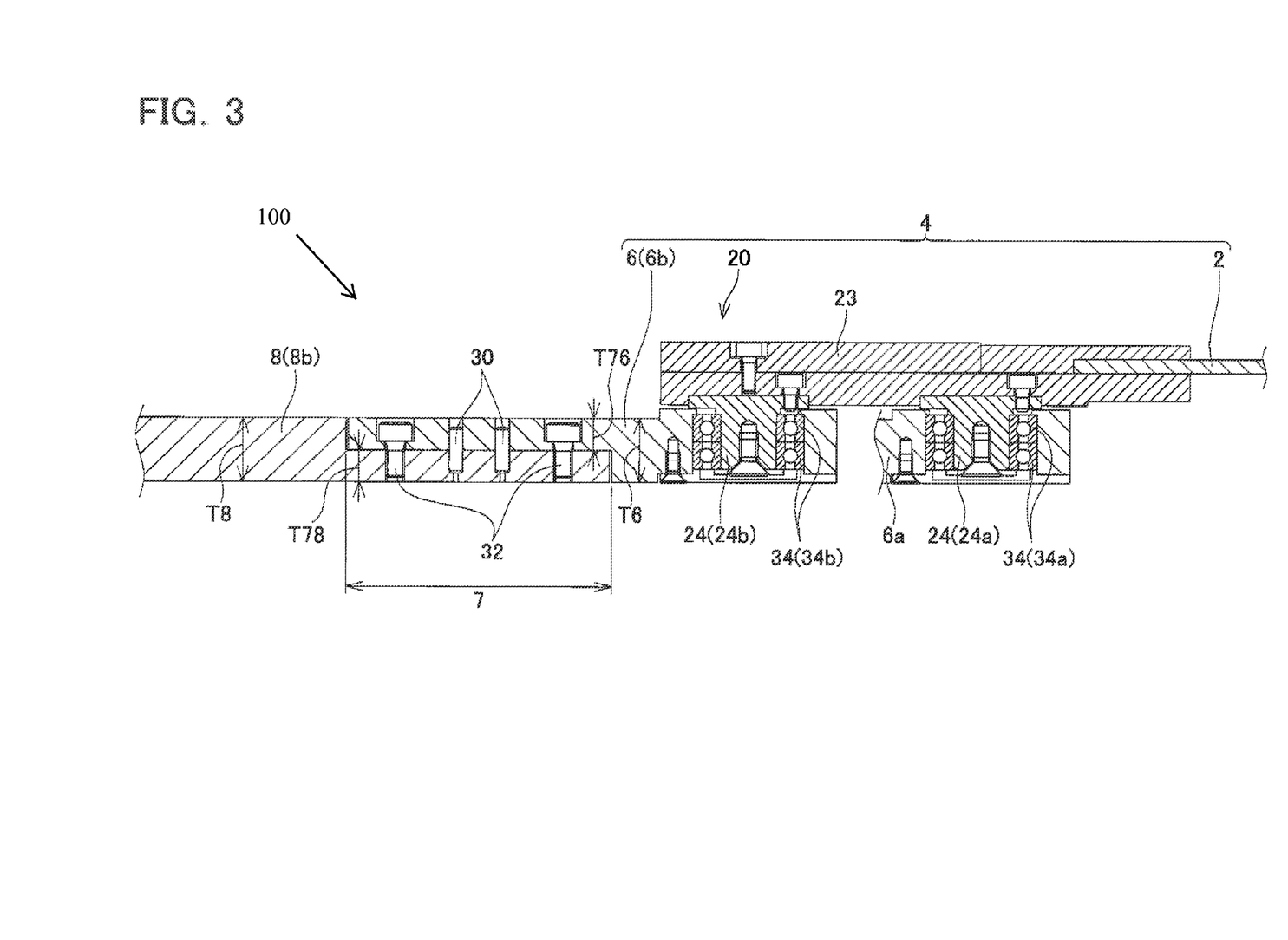
FIG. 3 shows a cross sectional view along a line III-III in FIG. 1.

The lower arm link proximal end portion 8 and the arm distal end unit 4 will be described with reference to FIG. 3. As was described above, the arm distal end unit 4 is comprised of the lower arm link distal end portion 6, the first joint 20, and the hand 2. The first joint 20 includes a base 23, and cylindrical portions 24 (24a, 24b) that are fixed to the base 23. A pair of first bearings 34 is respectively disposed between the cylindrical portions 24 and the lower arm link distal end portion 6 (6a, 6b). The first bearings 34 are cylindrical roller bearings. Furthermore, the first lower arm link distal end portion 6a rotatably supports the cylindrical portion 24a via the first bearing 34a. The second lower arm link distal end portion 6b rotatably supports the cylindrical portion 24b via the first bearing 34b. The cylindrical portion 24a and the cylindrical portion 24b are disposed along the direction X that the hand 2 reciprocally moves (linear movement).

As was described above, when the high-temperature semiconductor wafer comes into contact with the hand 2, the temperature of the hand 2 increases. The temperature of the first joint 20 increases in accordance with the temperature increase of the hand 2. Further, the temperature in the vicinities of the hand and the first joint also increases due to radiant heat from the semiconductor wafer, the process chamber, etc. The temperature in the vicinity of the first joint 20 may increase to over 200° C. depending on the temperature of the semiconductor wafer. The temperature of the first bearings 34 may increase, and lubricant within the first bearings 34 may degrade. In the robot arm 100, the arm distal end unit 4 can be detached from the lower arm link proximal end portion 8 in the state of the lower arm link distal end portion 6 and the hand 2 remaining connected. Therefore, after having removed the arm distal end unit 4 from the transfer chamber, the first joint 20 can be disassembled to perform maintenance on the first bearings 34. That is, maintenance work of the first bearings 34 is not required to be performed within the transfer chamber. The robot arm 100 can limit contamination within the transfer chamber as compared to previously-known robot arms.

With the robot arm 100, the arm distal end unit 4 is removed from the transfer chamber interior, and the maintenance of the first bearings 34 is performed outside the transfer chamber. After the maintenance has been performed, the arm distal end unit 4 is attached to the lower arm link proximal end portion 8. Since the maintenance of the first bearings 34 is not performed within the transfer chamber, the lubricant, etc. within the first bearings 34 does not scatter within the transfer chamber. Moreover, another arm distal end unit 4 than the arm distal end unit 4, which has been detached from the lower arm link proximal end portion 8, may be prepared in advance. Further, subsequent to the work of detaching the arm distal end unit 4, the arm distal end unit 4 that already underwent the maintenance may be attached to the lower arm link proximal end portion 8. The time for replacing the arm distal end unit 4 can be shortened.

Also in previously-known robot arms, the maintenance of the bearings can be performed without contaminating the transfer chamber if the entire robot arm is removed from the transfer chamber. As was described above, the degradation of the lubricant in the first bearings 34 is caused in accordance with temperature increases of the hand 2 that holds the high-temperature wafer(s). The distance of a second bearing in the second joint 11 from the hand 2 is farther than the distance of the first bearings 34. Therefore, maintenance of the second bearing in the second joint 11 is less frequently performed than the first bearings 34. In previously-known robot arms, in order to perform the maintenance of the first bearings outside the transfer chamber, parts (upper arm link, second bearing(s), etc.) that do not need to undergo maintenance must also be removed from the transfer chamber. On the other hand, the robot arm 100 makes possible removing the first bearings 34 (first joint 20) from the transfer chamber while leaving the second bearing(s) (second joint 11) within the transfer chamber. Consequently, it is possible to perform the maintenance work easier than with previously-known robot arms.

Other features of the robot arm 100 will be described. As shown in FIG. 3, a portion of the lower arm link proximal end portion 8 (the portion of the lower arm link proximal end portion 8 close to the hand 2) and a portion of the lower arm link distal end portion 6 (the portion of the lower arm link distal end portion 6 remote from the hand 2) overlap in the range 7. In the following description, the range 7 may be called an overlapping portion 7. In the overlapping portion 7, the lower arm link distal end portion 6 and the lower arm link proximal end portion 8 overlap in a direction perpendicular to a longitudinal direction of the lower arm link 10. More accurately, the lower arm link distal end portion 6 and the lower arm link proximal end portion 8 overlap in the direction perpendicular to the plane (horizontal plane) in which the hand 2 moves. That is, when the robot arm 100 is viewed in a plan view, the portion of the lower arm link distal end portion 6 and the portion of the lower arm link proximal end portion 8 overlap. In the robot arm 100, the lower arm link distal end portion 6 is positioned on the upper side relative to the lower arm link proximal end portion 8. Therefore, the work when detaching the arm distal end unit 4 from the robot arm 100 is easy to perform. Similarly, the work when attaching the arm distal end unit 4 to the lower arm link proximal end portion 8 is easy to perform.

In the overlapping portion 7, two positioning pins 30 are inserted into both of the lower arm link proximal end portion 8 and the lower arm link distal end portion 6. Positional displacement of the lower arm link proximal end portion 8 and the lower arm link distal end portion 6 is prevented by the positioning pins 30. In other words, a relative change in the angle of the lower arm link proximal end portion 8 and the lower arm link distal end portion 6 is prevented by the positioning pins 30.

The thickness T78 of the lower arm link proximal end portion 8 in the overlapping portion 7 is approximately half the thickness T8 of the lower arm link proximal end portion 8 at a position (non-overlapping portion) adjacent to the overlapping portion 7. Further, the thickness T76 of the lower arm link distal end portion 6 in the overlapping portion 7 is approximately half the thickness T6 of the lower arm link distal end portion 6 at a non-overlapping portion. The thickness T8 and the thickness T6 are identical. Therefore, in the direction perpendicular to the plane in which the hand 2 moves, the thickness T8, the thickness T6, and the thickness of the overlapping portion 7 are equal to each other. That is, the thickness of the lower arm link 10 in the longitudinal direction of the lower arm link 10 is constant. Due to this feature, when the hand 2 reciprocally moves, the lower arm link 10 is prevented from interfering with other links. Furthermore, the direction perpendicular to the plane in which the hand 2 moves corresponds to the vertical direction.

Figure 4:
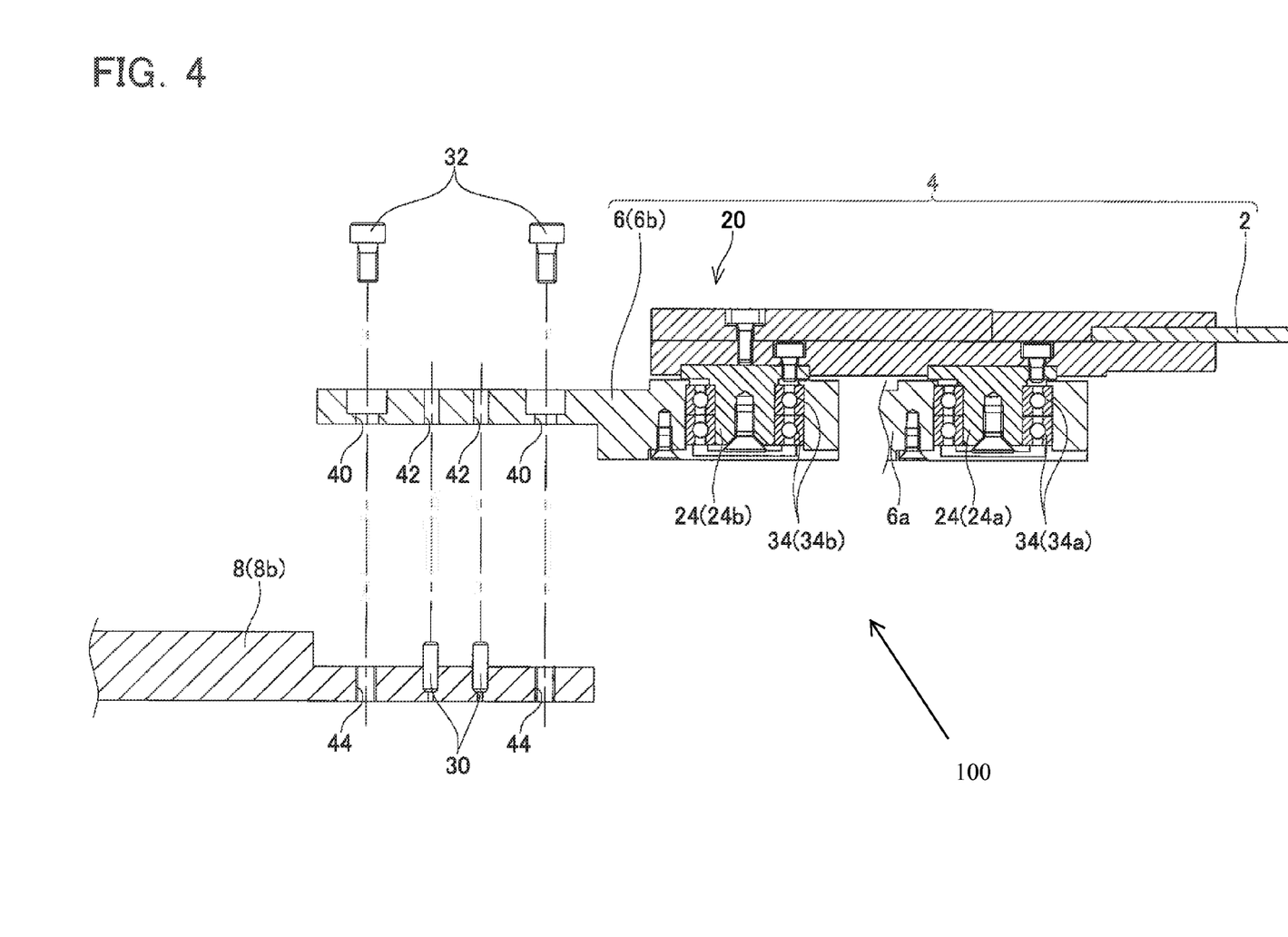
FIG. 4 shows a cross sectional view for describing a procedure of attaching a distal end portion of a lower arm link to a proximal end portion of the lower arm link.

As shown in FIG. 4, the positioning pins 30 are fixed to the lower arm link proximal end portion 8. Accordingly, when the lower arm link proximal end portion 8 and the lower arm link distal end portion 6 (arm distal end unit 4) are separated, the positioning pins 30 disengage from the lower arm link distal end portion 6. Therefore, when attaching the lower arm link distal end portion 6 (arm distal end unit 4) to the lower arm link proximal end portion 8, the lower arm link distal end portion 6 (arm distal end unit 4) can be attached while visually confirming the positions of the positioning pins 30. By providing pin through-holes 42 in the lower arm link distal end portion 6, the position of the lower arm link distal end portion 6 (arm distal end unit 4) relative to the lower arm link proximal end portion 8 is determined by fitting the positioning pins 30 into the pin through-holes 42.

In the longitudinal direction of the lower arm link 10, two bolt channels 44 are formed in the lower arm link proximal end portion 8. The two bolt channels 44 are respectively formed on the two sides of the positioning pins. Two bolt holes 40 are respectively formed on the two sides of the pin through-holes 42 in the lower arm link distal end portion 6. When attaching the arm distal end unit 4 to the lower arm link proximal end portion 8, bolts 32 are fixed in the bolt channel 44 after having inserted the positioning pins 30 into the pin through-holes 42. When the arm distal end unit 4 is attached to the lower arm link proximal end portion 8, as shown in FIG. 3, the two bolts 32 are respectively positioned on the two sides of the positioning pins 30 in the longitudinal direction of the lower arm link 10. Therefore, even if the hand 2 is deflected while using the robot arm 100, application of force to the positioning pins 30 can be limited. Since the positioning pins 30 are prevented from being deformed, the positional displacement of the hand 2 is prevented even if maintenance of the first bearings 34 is repeated.

While specific examples of the present invention have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously, and satisfying any one of those objectives gives technical utility to the present invention.

The invention claimed is:

1. A robot arm configured to transport semiconductor wafers, comprising:
   a hand configured to hold a semiconductor wafer;
   a lower arm link connected to the hand via a first joint; and
   an upper arm link connected to the lower arm link via a second joint,
   wherein the lower arm link comprises a first lower arm link and a second lower arm link that are kept parallel at all times,
   wherein the lower arm link is configured to be separable into two parts at a location between the first joint and the second joint,
   a proximal end portion of the lower arm link connected to the upper arm link and a distal end portion of the lower arm link connected to the hand are overlapping in a direction perpendicular to a longitudinal direction of the lower arm link,
   a plurality of positioning pins is disposed alongside in the longitudinal direction and is inserted into an overlapping portion of the proximal end portion and the distal end portion,
   the proximal end portion of the lower arm link and the distal end portion of the lower arm link are fixed by a plurality of bolts, and
   the plurality of bolts is disposed on opposite sides of the positioning pins that are disposed alongside in the longitudinal direction of the lower arm link.

2. The robot arm according to claim 1, wherein
   the hand is rotatable relative to the lower arm link via the first joint, and
   the lower arm link is rotatable relative to the upper arm link via the second joint.

3. The robot arm according to claim 1, wherein
   the upper arm link comprises a first upper arm link and a second upper arm link that are kept parallel at all times,
   the second upper arm link is a driving link and
   the first upper arm link is a follower link configured to move in accordance with movement of the second upper arm link.

4. The robot arm according to claim 1, wherein
   the distal end portion of the lower arm link is located on an upper side of the proximal end portion of the lower arm link.

5. The robot arm according to claim 4, wherein
   the positioning pins are fixed to the proximal end portion of the lower arm link, and
   the positioning pins and the distal end portion of the lower arm link are configured to be separable.

6. The robot arm according to claim 5, wherein
   each of the first and second joints comprises a bearing having a rotational axis that extends in a vertical direction and
   the hand is configured to move only in a horizontal direction, which is perpendicular to the vertical direction.

7. The robot arm according to claim 6, wherein
   the distal end portion and the proximal end portion of the lower arm link overlap at an overlapping portion having a thickness equal the thickness of a non-overlapping portion of the lower arm link that is adjacent to the overlapping portion.

8. The robot arm according to claim 7, wherein
   the hand is rotatable relative to the lower arm link via the first joint, and
   the lower arm link is rotatable relative to the upper arm link via the second joint.

9. The robot arm according to claim 8, wherein
   the upper arm link comprises a first upper arm link and a second upper arm link that are kept parallel at all times,
   the second upper arm link is a driving link and
   the first upper arm link is a follower link configured to move in accordance with movement of the second upper arm link.

10. The robot arm according to claim 1, wherein
    each of the first and second joints comprises a bearing having a rotational axis that extends in a vertical direction and
    the hand is configured to move only in a horizontal direction, which is perpendicular to the vertical direction.

11. The robot arm according to claim 1, wherein
    a distal end portion and a proximal end portion of the lower arm link overlap at an overlapping portion having a thickness equal the thickness of a non-overlapping portion of the lower arm link that is adjacent to the overlapping portion.

12. The robot arm according to claim 1, wherein
    the distal end portion of the lower arm link is located on an upper side of the proximal end portion of the lower arm link.

13. The robot arm according to claim 1, wherein
    the positioning pins are fixed to the proximal end portion of the lower arm link, and
    the positioning pins and the distal end portion of the lower arm link are configured to be separable.

14. A robot arm configured to transport semiconductor wafers, comprising:
    a hand configured to hold a semiconductor wafer;
    a lower arm link connected to the hand via a first joint; and
    an upper arm link connected to the lower arm link via a second joint,
    wherein the lower arm link comprises a first lower arm link and a second lower arm link that are kept parallel at all times,
    wherein the lower arm link is configured to be separable into two parts at a location between the first joint and the second joint,
    wherein a proximal end portion of the lower arm link connected to the upper arm link and a distal end portion of the lower arm link connected to the hand are overlapping in a direction perpendicular to a longitudinal direction of the lower arm link,
    wherein a plurality of positioning pins is inserted into an overlapping portion of the proximal end portion and the distal end portion, and wherein
the proximal end portion of the lower arm link and the distal end portion of the lower arm link are fixed by a plurality of bolts, and the plurality of bolts is disposed on opposite sides of the positioning pins in the longitudinal direction of the lower arm link.

15. The robot arm according to claim 14, wherein the plurality of positioning pins are fixed to a first one of the proximal end portion and the distal end portion and wherein a second one of the proximal end portion and the distal end portion includes a plurality of pin through holes and wherein the plurality of pins are configured to be slidably, linearly receivable in the plurality of pin through holes.

16. The robot arm according to claim 15, wherein the plurality of positioning pins project from the first one of the proximal end portion and the distal end portion in a first direction, wherein the plurality of bolts each comprise a shank and a head having a width greater than a width of the shank, and wherein the shanks of the plurality of bolts extend from the second one of the proximal end portion and the distal end portion and into the first one of the proximal end portion and the distal end portion in a second direction opposite the first direction.

17. The robot arm according to claim 15,
wherein the proximal end portion has first and second opposite sides and the distal end portion has first and second opposite sides and the first side of the proximal end portion is in contact with the first side of the distal end portion, wherein the plurality of positioning pins project from the first side of the first one of the proximal end portion and the distal end portion and into the first side of the second one of the proximal end portion and the distal end portion, wherein the plurality of bolts each comprise a shank having a width and a head having a width greater than a width of the shank and are inserted from the second side of the second one of the proximal end portion and the distal end portion to extend out of the first side of the second one of the proximal end portion and the distal end portion and into the first side of the first one of the proximal end portion and the distal end portion, and wherein the shank of the each of the plurality of bolts passes through an opening in the first side of the second one of the proximal end portion and the distal end portion having a width less than the width of the head of each of the plurality of bolts.

18. The robot arm according to claim 17, wherein the plurality of pins are configured to allow the proximal end portion to move relative to the distal end portion in a direction of a longitudinal axis of one of the plurality of pins and wherein the plurality of bolts are configured to prevent the proximal end portion from moving relative to the distal end portion in the direction.

* * * * *